United States Patent [19]

Hayakawa

[11] Patent Number: 5,084,892
[45] Date of Patent: Jan. 28, 1992

[54] WIDE GAIN REGION LASER DIODE

[75] Inventor: Toshiro Hayakawa, Yokohama, Japan

[73] Assignee: Eastman Kodak Company, Rochester, N.Y.

[21] Appl. No.: 676,634

[22] Filed: Mar. 28, 1991

[30] Foreign Application Priority Data

Apr. 11, 1990 [JP] Japan .................................. 2-95417

[51] Int. Cl.$^5$ ............................................. H01S 3/19
[52] U.S. Cl. .................................... 372/45; 372/46; 372/96
[58] Field of Search .......................... 372/45, 46, 96

[56] References Cited

U.S. PATENT DOCUMENTS 4,837,775  6/1989  Andrews et al. .................. 372/96
4,984,243  1/1991  Kagawa et al. ................... 372/46

Primary Examiner—Georgia Epps
Attorney, Agent, or Firm—Raymond L. Owens

[57] ABSTRACT

A laser diode with a wide gain region (active layer) in which the side faces of the layers defining the gain region width are corrugated to suppress non-Fabry-Perot mode laser frequencies by scattering the light produced by stimulated emission.

15 Claims, 3 Drawing Sheets

WIDE GAIN REGION LASER DIODE

FIELD OF THE INVENTION

The present invention relates to wide gain-region laser diodes, and particularly to a refractive index waveguide type wide gain-region laser diode which suppresses non-Fabry-Perot laser oscillation modes.

BACKGROUND OF THE INVENTION

In recent years optical communication technology and optical information processing technology have assumed a central role in a wide range of fields. Digital optical communication using optical fibers has made it possible to realize large increases in information processing in which the technology has been extensively utilized in the form of optical disks and laser printers and the like. Related fields of application are expanding at a remarkable pace.

Advances in laser diodes, which form the light source in such application, have played a major role in the development of such technologies. The small size and high efficiency of laser diodes have brought them into widespread use as laser light sources in compact disk, video disk, and optical communication systems.

In a laser diode the lasting action is generated by the injection of electrons into a P-N junction active layer. With recent advances in semiconductor technology, especially MBE (molecular beam epitaxy) and MOCVD (metal-organic chemical vapor deposition), enabling the controlled growth of epitaxial layers as thin as 10 Å or less, have made it possible to utilize epitaxial layers with good uniformity to produce laser oscillation throughout the whole width of the gain region (active region) even when the region has a relatively large width, without giving rise to the phenomenon of filament oscillation.

FIG. 4(A) illustrates a prior art wide gain-region laser diode with an emission region 30 micrometers or more in width, using a refractive index waveguide type arrangement in which an active layer 10 is sandwiched between layers having different refractive index. Layer 10 has resonator end faces 12 and side faces 14. In a low power laser diode with an output in the order of 100 mW, the width W of the active layer 10 is made 10 micrometers or less so that it acts as a single mode optical waveguide, with a resonator length L of around 250 micrometers. In a wide gain-region laser diode, the width W is set at 30 micrometers or more to achieve a high output. Increasing the width W thus makes it possible to obtain an output of one watt or more compared to the output of 100 mW obtained with the usual width of 10 micrometers or less.

FIG. 4(B) shows the path of light in the active layer 10. Owing to the small L/W ratio, setting the width W to 30 micrometers or more to raise the output increases the probability that in addition to Fabry-Perot modes (indicated by the solid double headed arrows), modes generated between the resonator end faces 12 will also include modes produced by reflections from the side faces 14 of the active layer 10, which are indicated in the drawing by broken lines. As such modes including side wall reflections have oscillation patterns which differ from those arising from Fabry-Perot modes, they destabilize the oscillation pattern of the laser diode, making it very difficult to obtain uniform oscillation.

SUMMARY OF THE INVENTION

In view of the drawbacks of the conventional arrangements, an object of the present invention is to provide a wide gain-region laser diode able to provide uniform oscillation.

In accordance with the present invention, this object is achieved in a wide gain-region laser diode having layers forming a gain region constituting the active layer that is 30 micrometers or more wide and comprises means for suppressing non-Fabry-Perot mode laser frequencies. Such means are achieved by corrugating the side faces of the layers defining the width of the active layer. Fluctuations in the differences in the refractive indexes produced by this corrugation of the side faces cause scattering of the laser light.

More specifically, producing a refractive index differential in the active layer and corrugating the side faces of the layers defining the gain region produces fluctuations in the boundaries between the different refractive indexes, and as the reflection by these boundaries of the light produced by the stimulated emission makes it difficult for oscillation modes which include side wall reflections to arise, it becomes possible to generate just single-frequency Fabry-Perot modes.

Further features of the invention, its nature and various advantages will be more apparent from the accompanying drawings and following detailed description of the invention.

It should be understood that the drawings are not necessarily drawn to scale.

DETAILED DESCRIPTION

Figure 1A:
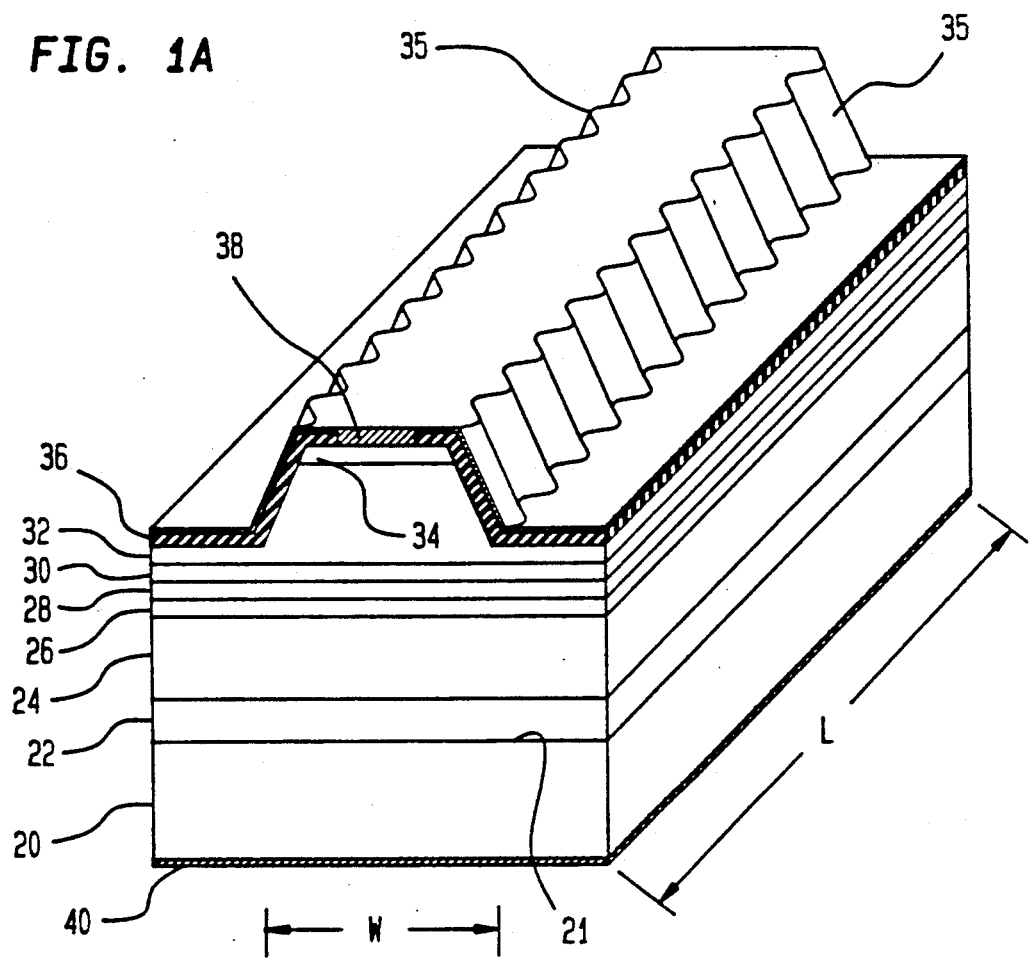
FIG. 1(A) is a perspective view of a first embodiment of the wide gain-region laser diode according to the present invention.

FIG. 1(A) shows a first embodiment of a wide gain-region laser diode 18 according to the present invention. The laser diode 18 comprises a n-GaAs semiconductor substrate 20 having on a surface 21 thereof an n-type conductivity GaAs epitaxial layer 22. The layer 22 is 0.5 micrometer in thickness and is doped with silicon to a concentration of $1 \times 10^{18}$ impurities/cm$^3$. On the layer 22 is an n-type conductivity $Al_{0.7}Ga_{0.3}As$ cladding layer 24 which is 1.5 micrometers in thickness and is doped with silicon to a concentration of $1 \times 10^{18}$ impurities/cm$^3$. An undoped $Al_xGa_{1-x}As$ (with x being between 0.7 and 0.15) compositionally graded layer 26, 0.15 micrometer in thickness, is on the cladding layer 24 followed by an undoped GaAs quantum well layer 28, 0.01 micrometers in thickness. On the quantum well layer 28 is an undoped $Al_xGa_{1-x}As$ (with x being between 0.15 and 0.7) compositionally graded layer 30, 0.15 micrometers in thickness. On the compositionally graded layer 30 is a p-type conductivity $Al_{0.7}Ga_{0.3}A$ cladding layer 32 which is 1.5 micrometers in thickness and doped with beryllium to a concentration of $1 \times 10^{18}$ impurities/cm$^3$. Finally a p-type conductivity GaAs cap layer 34 which is 0.2 micrometers in thickness and is doped with beryllium to a concentration of $1 \times 10^{19}$ impurities/cm$^3$. The various layers are epitaxially deposited on the substrate 20 using molecular beam epitaxy. Portions of the sides of the cap layer 34, the cladding layer 32 are removed so that they are of the desired width W of 50 micrometers. This is achieved by photolithography and chlorine gas reactive ion-beam etching (RIE). At the same time on the side walls of the p-Al$_{0.7}$Ga$_{0.3}$As cladding layer 32 and the p-GaAs cap layer 34, are etched corrugations 35 with an amplitude of 1 to 5 micrometers and a pitch of about 5 micrometers. The etching is done in a way that leaves an additional 0.1 micrometers or so of the p-Al$_{0.7}$Ga$_{0.3}$As cladding layer 32 adjacent the compositionally graded layer 30 beyond the width W.

A SiN$_x$ layer 36 is then formed by means of plasma CVD over the cladding layer 32 and the cap layer 34 and removed from the top of the cap layer 34, which is the gain region portion. A layer 38 of Cr/Au is deposited over the SiN$_x$ layer 36 and into contact with the cap layer 34 to form a p-electrode. A layer 40 of AuGe/Ni/Au is used to form an n-electrode on the bottom face of the n-GaAs substrate 20.

Figure 1B:
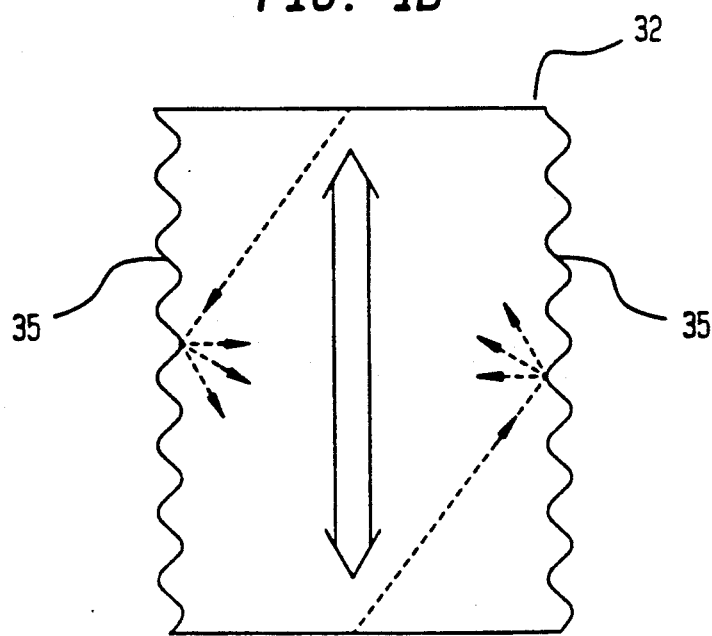
FIG. 1(B) is a schematic view of the top surface of the active region of the embodiment shown in FIG. 1(A) illustrating the flow of light in the active region.

In the laser diode 18 of the first embodiment thus formed by the above processes, light emission is stimulated by carrier injection, under prescribed forward bias conditions between the p-electrode 38 and the n-electrode 40, into the undoped GaAs quantum well layer 28 constituting the active layer. The p-Al$_{0.7}$Ga$_{0.3}$As cladding layer 32 formed above the undoped GaAs quantum well layer 28 is etched to form a raised portion which produces an interface between the internal and external refractive indexes. This forms a refractive index waveguide type structure defining the width W of the gain region. FIG. 1 (B) shows light paths in an active portion of layer 32. The solid line double headed arrows show the Fabry-Perot mode of operation. By corrugating the side faces of the p-Al$_{0.7}$Ga$_{0.3}$As cladding layer 32, in accordance with this embodiment, as shown in FIG. 1 (B), a boundary with a periodic interface is produced between the refractive indexes, scattering the emitted light and enabling non-Fabry-Perot modes (indicated by the dashed line arrows) to be suppressed.

In this first embodiment 18 the resonator length L is 500 micrometers, and an output of 200 mW is produced with a threshold current of 70 mA. This provides a relatively uniform near-field pattern and a single-peak far-field pattern laser light with a full-width at half maximum of 2 degrees.

Figure 2:
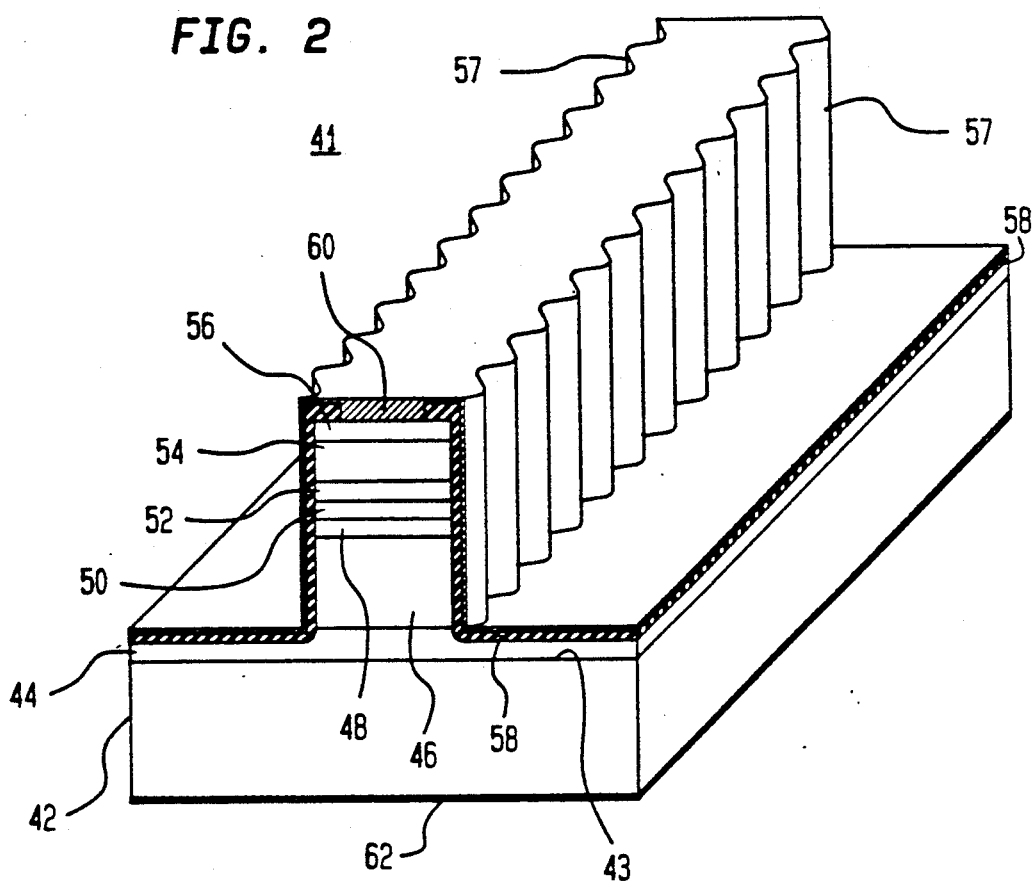
FIG. 2 is a perspective view of a second embodiment of the laser diode of the invention.

FIG. 2 shows a second embodiment 41 of a laser diode according to the present invention. Laser diode 41 comprises an n-type conductivity GaAs substrate 42 having on a surface 43 thereof an n-type conductivity GaAS epitaxial layer 44 which is 0.5 micrometer in thickness and is doped with sulfur to a concentration of $1 \times 10^{18}$ impurities/cm$^3$. On the layer 44 is an n-type conductivity Al$_{0.7}$Ga$_{0.3}$As cladding layer 46 which is 1.5 micrometers in thickness and is doped with sulfur to a concentration of $1 \times 10^{18}$ impurities/cm$^3$. An undoped Al$_{0.2}$Ga$_{0.8}$As layer 48, 0.15 micrometers in thickness, is on the cladding layer 46 followed by an undoped GaAs quantum well layer 50 which is 0.01 micrometers thick. On the quantum well layer 50 is an undoped Al$_{0.2}$Ga$_{0.}$-
$_8$As layer 52, 0.15 micrometers in thickness, followed by a p-type conductivity Al$_{0.7}$Ga$_{0.3}$As cladding layer 54, which is 1.5 micrometers in thickness and is doped with zinc to a concentration of $1 \times 10^{18}$ impurities/cm$^3$, and finally by a p-type conductivity GaAs cap layer 56. A cap layer 56 is of a thickness of 0.2 micrometers and is doped with zinc to a concentration of $1 \times 10^{19}$ impurities/cm$^3$. The various layers are epitaxially deposited in succession on the substrate 42 using MOCVD. Following this, portions of the sides of the cladding layer 46, the layer 48, the quantum well layer 50, the layer 52, the cladding layer 54 and the cap layer 56 are removed using photolithography and sulfuric acid etching to form the gain region of a desired width W. At the same time on the side walls of the layers from the cladding layer 46 to the cap layer 56, corrugations 57 are etched with an amplitude of several micrometers and a pitch of several micrometers, to produce a width W of 100 micrometers.

A SiN$_x$ layer 58 is then formed over the layer 44, the sides of layers 46, 48, 50, 52 and 54, and over the cap layer 56 by means of plasma CVD and removed from a portion of the top of the cap layer 56. A layer 60 of Cr/Au is deposited over the SiN$_x$ layer 58 and into contact with the cap layer 56 to form a p-electrode. A layer of AuGe/Ni/Au is coated over the bottom face of the substrate 42 to form an n-electrode 62.

In the laser diode 41 of the second embodiment thus formed by the above processes, light emission is stimulated by carrier injection under prescribed forward bias conditions between the p-electrode 60 and the n-electrode 62, into the undoped GaAs quantum well layer 50 which has a width W of 100 micrometers. By corrugating the side faces of this active layer, as described above, the light produced by stimulated emission is scattered, enabling non-Fabry-Perot modes to be suppressed.

In this second embodiment 41 the resonator length L is 500 micrometers, and an output of 200 mW is produced with a threshold current of 130 mA. This provides a relatively uniform near-field pattern and a single-peak far-field pattern laser light with a full-width at half maximum of 1 degree.

Figure 3:
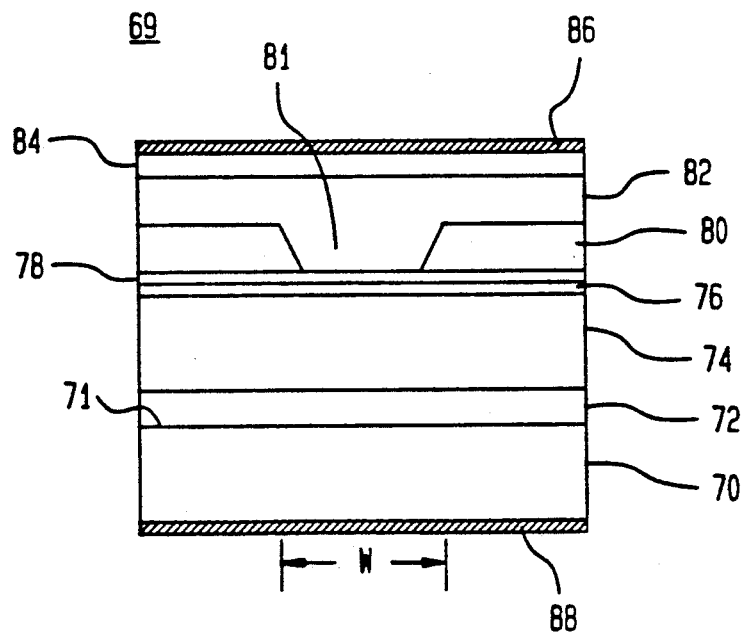
FIG. 3 is a sectional view of a third embodiment of the laser diode of the invention.
Figure 4A:
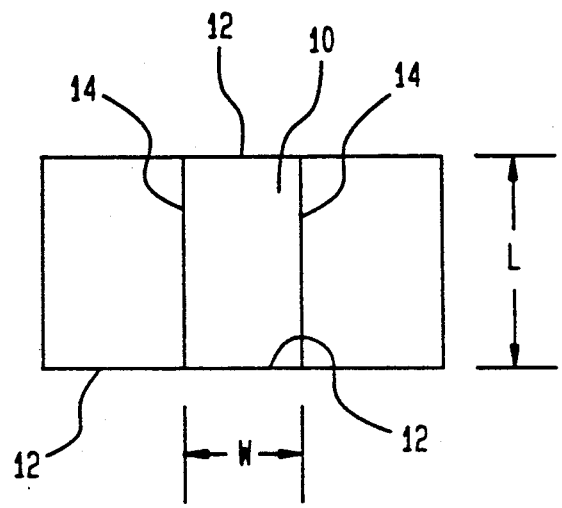
FIG. 4(A) is a top plan view of a conventional wide gain-region laser diode of the prior art.
Figure 4B:
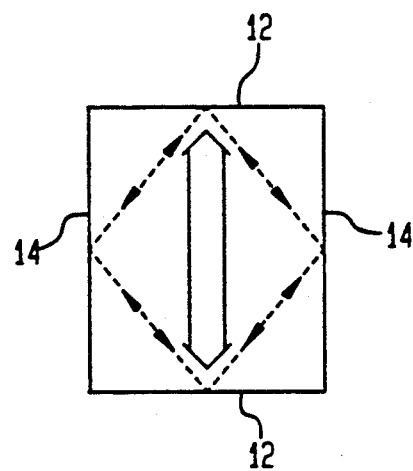
FIG. 4(B) is a schematic view explanatory of the oscillation mode of the laser diode shown in FIG. 4(A).

FIG. 3 shows a cross-sectional view of a third embodiment 69 of a laser diode according to the invention. The laser diode 69 comprises an n-type conductivity GaAs substrate 70 having on a surface 71 thereof an n-type conductivity GaAs epitaxial layer 72 which is 0.5 micrometer in thickness and doped with sulfur to a concentration of $1 \times 10^{18}$ impurities/cm$^3$. On the epitaxial layer 72 is an n-type conductivity Al$_{0.45}$Ga$_{0.55}$As cladding layer 74, 1.5 micrometers in thickness and doped with sulfur to a concentration of $1 \times 10^{18}$ impurities/cm$^3$. On the cladding layer 74 is an undoped Al$_{0.15}$Ga$_{0.85}$As active layer 76, 0.08 micrometers thick, followed by a p-type conductivity Al$_{0.45}$Ga$_{0.55}$As cladding layer 78, which is 0.2 micrometers thick and is doped With zinc to a concentration of $1 \times 10^{18}$ impurities/cm$^3$. An n-type conductivity GaAs current restriction layer 80, which is 0.8 micrometers thick and is doped with sulfur to a concentration of $3 \times 10^{18}$ impurities/cm$^3$, is on the cladding layer 78. The layers 72, 74, 76, 78 and 80 are epitaxially deposited on the substrate 70 in succession using MOCVD.

After the current restriction layer 80 is deposited, an opening 81 is formed therethrough using photolithography and sulfuric acid etching. At the same time, the side walls of the opening 81 in the current restriction layer 80 are etched to form corrugations, not shown, with an amplitude of several micrometers and a pitch of several micrometers, to produce a width W of 60 micrometers. MOCVD is then used to further form a p-type conductivity $Al_{0.45}Ga_{0.55}As$ cladding layer 82 which also fills the opening 81 in the current restriction layer 80 to contact the cladding layer 78. The cladding layer 82 is of a thickness of 1.7 micrometers in the flat portion outside the opening 81, which forms the gain region, and is doped with zinc to a concentration of $1 \times 10^{18}$ impurities/cm$^3$. On the cladding layer 82 is a p-type conductivity GaAs cap layer 84 which is 0.2 micrometers in thickness and is doped with zinc to a concentration of $1 \times 10^{19}$ impurities/cm$^3$. Finally, a layer 86 of AuZn/Au is deposited on the cap layer 84 to form a p-electrode, and a layer 88 of AuGe/Ni/Au is deposited on the bottom surface of the substrate 70 to form an n-electrode.

In this third embodiment 69 of the laser diode thus formed by the above processes, light emission is stimulated by carrier injection, under prescribed forward bias conditions between the p-electrode 86 and the n-electrode 88, into the active layer 76. Here, the gain region width is defined by the width of the current restriction layer 80, which is 60 micrometers. Again, the side faces of this layer, as in the case of the first embodiment, are corrugated to thereby suppress non-Fabry-Perot modes.

Although the above three embodiments have been described with reference to a GaAs/AlGaAs system laser diode, it is to be understood that the present invention is not limited thereto, but may be applied to a laser diode of other materials, such as InGaAs, AlGaInP, or InGaAsP, for example.

What is claimed is:

1. A laser diode having layers forming an active layer, a resonant cavity and a wide gain region 30 micrometers or more in width in which the side faces of layers defining the gain region width include means for suppressing non-Fabry-Perot mode laser frequencies, and electrodes by which a voltage can be applied across the layers.

2. The laser diode of claim 1 in which the means for suppressing non-Fabry-Perot mode laser frequencies comprises corrugations in the side faces.

3. A laser diode comprising:
a body of a semiconductor material;
said body having an active region and a resonant cavity;
a wide gain region in said body defined by a pair of opposed side walls;
means along said side walls for suppressing non-Fabry-Perot mode laser frequencies; and
electrodes on said body at opposite sides of the active layer.

4. The laser diode of claim 3 in which the wide gain region is of a width of at least 30 micrometers.

5. The laser diode of claim 4 in which the means for suppressing non-Fabry-Perot mode laser frequencies comprises corrugations in the side walls.

6. The laser diode of claim 5 in which the corrugations have an amplitude of 1 to 5 micrometers.

7. The laser diode of claim 6 in which the corrugations have a pitch of about 5 micrometers.

8. A laser diode comprising:
a substrate of a semiconductor material;
a first cladding layer of a semiconductor material of one conductivity type on the substrate;
an active layer of a semiconductor material on the first cladding layer;
a second cladding layer of a semiconductor material of the opposite conductivity type on the active layer;
at least one of said layers defining a gain region having opposed side walls;
means on said side walls for suppressing non-Fabry-Perot mode laser frequencies; and
electrodes on said substrate at opposite sides of the active layer.

9. The laser diode of claim 8 in which the gain region is of a width of at least 30 micrometers.

10. The laser diode of claim 9 in which the means for suppressing non-Fabry-Perot mode laser frequencies comprises corrugations in the side walls.

11. The laser diode of claim 10 in which the gain region is defined by at least a portion of one of said cladding layers being of a width less than the width of the active layer and having opposed side walls which are spaced apart at least 30 micrometers and have the corrugations therein.

12. The laser diode of claim 10 in which the gain region is defined by the cladding layers and the active layer all being of a width less than the width of the substrate and having opposed side walls which are spaced apart at least 30 micrometers and have the corrugations therein.

13. The laser diode of claim 10 further comprising a current restriction layer between one of the cladding layers and the active layer, said current restriction layer being of a semiconductor material of a conductivity type opposite that of the one cladding layer and having an opening therethrough through which the one cladding layer extends, the opening having opposed side walls which are spaced apart at least 30 micrometers and which have the corrugations therein.

14. The laser diode of claim 13 in which the corrugations have an amplitude of 1 to 5 micrometers.

15. The laser diode of claim 14 in which the corrugations have a pitch of about 5 micrometers.

* * * * *